United States Patent [19]
Phillips et al.

[11] Patent Number: 5,885,672
[45] Date of Patent: Mar. 23, 1999

[54] COATED BARRIER FILM AND PACKAGING UTILIZING THE SAME AND METHOD

[75] Inventors: Roger W. Phillips; Paul G. Coombs; Lauren R. Wendt, all of Santa Rosa, Calif.

[73] Assignee: Flex Products, Inc., Santa Rosa, Calif.

[21] Appl. No.: 721,341

[22] Filed: Sep. 26, 1996

Related U.S. Application Data

[63] Continuation-in-part of Ser. No. 534,189, Sep. 26, 1995, abandoned, which is a continuation of Ser. No. 234,471, Apr. 26, 1994, Pat. No. 5,500,302, which is a continuation-in-part of Ser. No. 34,728, Mar. 22, 1993, abandoned, which is a continuation-in-part of Ser. No. 818,399, Jan. 2, 1992, abandoned, which is a continuation of Ser. No. 343,900, Apr. 26, 1989, abandoned.

[51] Int. Cl.⁶ ........................................... B32B 1/00
[52] U.S. Cl. ................. 428/35.2; 428/408; 428/411.1
[58] Field of Search .................... 428/408, 35.2, 428/411.1, 474.4, 216, 480

[56] References Cited

U.S. PATENT DOCUMENTS

| | | | |
|---|---|---|---|
| 4,421,622 | 12/1983 | Hollars | 204/192 P |
| 4,702,963 | 10/1987 | Phillips et al. | 428/426 |
| 4,756,964 | 7/1988 | Kincaid et al. | 428/408 |
| 5,500,302 | 3/1996 | Phillips et al. | 428/474.4 |
| 5,641,719 | 6/1997 | Coombs et al. | 501/134 |
| 5,670,240 | 9/1997 | Davis | 428/195 |
| 5,691,063 | 11/1997 | Davis et al. | 428/411.1 |

FOREIGN PATENT DOCUMENTS

WO88/08043  10/1988  WIPO.

OTHER PUBLICATIONS

Alterovitz, et al., "Variable Angle Spectroscopic Ellipsometry", *Solid State Technology*, Mar. 1988 (pp. 99–102).

Primary Examiner—Robert Harrison
Attorney, Agent, or Firm—Workman, Nydegger & Seeley

[57] ABSTRACT

A package or wrapping comprised of a material in the form of a liquid or a solid which is sensitive to water and oxygen. A coated barrier film is sealed about the material and forms a sealed enclosure about the material and serves to protect the material from water vapor and oxygen. The coated barrier film has low oxygen and water permeability and comprises a flexible substantially transparent plastic substrate with first and second surfaces and a thickness ranging from 1 to 7 mils. A substantially colorless barrier coating is formed on at least one of the surfaces and consists solely of graphite free of hydrogen and has a thickness ranging from 50Å to 300Å. The barrier film has a reduced water transmission rate and a reduced oxygen transmission rate with respect to the uncoated substrate and has a visible transparency of 30% or greater.

10 Claims, 2 Drawing Sheets

COATED BARRIER FILM AND PACKAGING UTILIZING THE SAME AND METHOD

This application is a continuation-in-part of application Ser. No. 08/534,189 filed Sep. 26, 1995, abandoned, which is a continuation of application Ser. No. 08/234,471 filed Apr. 26, 1994, now U.S. Pat. No. 5,500,302, which is a continuation-in-part of application Ser. No. 07/034,728 filed Mar. 22, 1993, abandoned, which is a continuation-in-part of application Ser. No. 07/818,399 filed Jan. 2, 1992, abandoned, which is a continuation of application Ser. No. 07/343,900 filed Apr. 26, 1989, abandoned.

This invention relates to a water vapor and oxygen impermeable coated barrier film and packaging using the same and more particularly to a coated colorless flexible plastic film which is provided with a barrier coating formed solely of graphite and free of hydrogen that substantially reduces the water vapor transmission rate (WVTR) and oxygen transmission rate (OTR) in such packaging.

Coated barrier films have heretofore been provided as in U.S. Pat. No. 4,702,963 which has many desirable characteristics. However, the film in U.S. Pat. No. 4,702,963 has one inherent characteristic which is undesirable in certain applications because it has an amber color. In certain situations it is desirable to ascertain when a product changes color as, for example, turns yellow. This is difficult to ascertain in an amber-colored film. In U.S. Pat. No. 4,557,946, there are disclosed organosilicone films in which the protective film is provided by utilizing a plasma polymerized organosilicone material having an inorganic component. These plasma deposited films had to be deposited onto heated substrates (approximately 180° C.) in order to achieve adequate adhesion and impermeability. In an article entitled "Variable Angle Spectroscopic Ellipsometry" by Alterovitz et al. published in *Solid State Technology* for March, 1988 there is a disclosure of ellipsometric experiments which were carried out which included the analysis of moisture penetration of dielectrics. One insulator studied was a plasma deposited semitransparent amorphous carbon film on a silicon substrate. The article pointed out than analysis showed that even after immersion for several hours, hot water did not penetrate any carbon film 250 Angstroms or thicker. This article did not address gaseous water permeation, only aqueous water permeation. Furthermore none of the published information discloses or suggests how the need for a substantially colorless transparent barrier film could be made. There is therefore a need for a new and improved and substantially colorless transparent coated barrier film, and particularly a coated barrier film which can be used for packaging liquids and solids that are water and oxygen sensitive.

In general, it is an object of the invention to provide a substantially colorless coated barrier film and packaging utilizing the same.

Another object of the invention is to provide a coated barrier film of the above character which has excellent mechanical properties.

Another object of the invention is to provide a coated barrier film of the above character which readily meets the medical requirements for barrier films for packaging with respect to penetration of oxygen and moisture.

Another object of the invention is to provide a coated barrier film of the above character which provides good overall visual transmission.

Additional objects and features of the invention will appear from the following description in which the preferred embodiments are set forth in detail in conjunction with the accompanying drawings.

In general, it is an object of the present invention to provide a packaging and wrapping coated barrier film which is comprised of a flexible substantially transparent film substrate having first and second surfaces. A barrier coating is formed on at least one of the surfaces of the film substrate and is formed solely of graphite free of hydrogen having a thickness ranging from 50 to 300 Angstroms. In the method, the graphite is deposited by use of an electron beam or by sputtering using multiple cathodes. Although sputtering yields of graphite is low, the thin coatings of graphite required and the use of multi-cathodes offset these limitations. A package or wrapping utilizing this coated barrier film protects water and oxygen sensitive materials packaged therein from high water vapor and oxygen while permitting viewing the materials.

Figure 1:
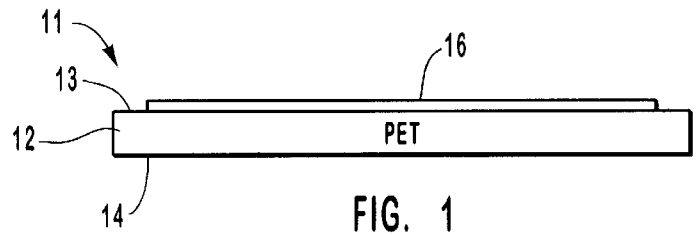
FIG. 1 is a cross-sectional view of a coated barrier film incorporating the present invention in which a barrier coating is utilized on only one side of the film substrate.

As shown in FIG. 1 of the drawings, the coated barrier film 11 is comprised of a flexible film substrate 12 formed of a suitable plastic such as a polymer. A polyester such as polyethylene terephthalate (PET) can be utilized having a thickness ranging from 1 to 7 mils. The substrate is provided with first and second surfaces 13 and 14. The substrate in accordance with the present invention should be transparent or substantially transparent to visible light. A barrier coating 16 is formed on at least one surface, as for example, the surface 13 shown in FIG. 1. The barrier coating 16 in accordance with the present invention is formed of graphite substantially free of hydrogen deposited to a thickness ranging from 50 Angstroms to 300 Angstroms depending upon the water vapor transmission rate (WVTR) and the oxygen transmission rate (OTR) requirements desired. Higher thicknesses can be used, but at thicknesses above 300 Angstroms, the optical transmittance of the barrier film plus substrate is reduced to below 30% and is thus not considered as being substantially transparent to visible light. Thus the same materials may be used to produce an opaque coated barrier film where the thickness of the barrier coating less the substrate would range from 300 to 1000 Angstroms.

The barrier coating of the graphite is preferably deposited utilizing an electron gun to evaporate graphite starting material for deposition of graphite substantially free of hydrogen in a conventional vacuum chamber. The graphite barrier coating 16 can be deposited in a single pass or, if desired, in multiple passes so that the total thickness is the same as for the single pass. Even though graphite is generally a very opaque material, it has been found that at the thickness of 50 to 300 Angstroms it still can provide good transmission characteristics at the barrier levels desired. Although the graphite barrier coating has a color, in the thickness utilized for the barrier coating, the color is relatively neutral or a very light gray which becomes slightly darker at greater thicknesses of up to 300 Angstroms and thus is substantially colorless.

It has been found that the barrier coating has good adhesion. Utilizing a conventional 3M tape adhesive pull-off test (see MIL-C-675A) the barrier coating will pass that test. The barrier coating also passes the cheesecloth test by withstanding from 60 to 120 cheesecloth rubs before any scratches appear in the coating. The barrier coating does not crack or flake off when the flexible plastic substrate 12 is creased or flexed.

The coated thin film shown in FIG. 1 has been tested for its permeability to oxygen and water. It readily passes medical specifications for oxygen and water permeability for packaging and wrapping films. By way of example, it has been found that a substrate 12 formed of a 2 mil PET provided a 55% overall visual transmission and a WVTR of 0.02 grams/100 square inches/24 hour period at 100° F. and at 90% relative humidity and an OTR of 0.04 cubic centimeters/100 square inches/day at 74° F. at one atmosphere and a relative humidity of 0%. In comparison a 2 mil uncoated polyester has a WVTR and OTR of 0.56 to 0.63 grams/100 square inches/day and 1.97 cc/100 square inches/day.

Figure 2:
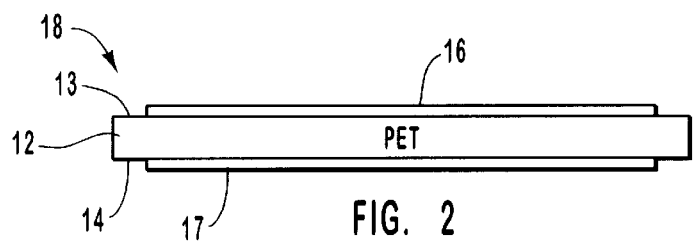
FIG. 2 is a cross-sectional view of a coated barrier film incorporating the present invention in which a barrier coating is provided on both sides of the film substrate.

When additional impermeability is required, an additional barrier coating 17 can be provided on the surface 14 on the other side of the substrate 12 as shown in FIG. 2 which can be formed of the same material to the same thickness as the barrier coating 16. Thus there is provided in a coated barrier film 18 which has approximately twice the moisture and oxygen impermeable characteristics of the barrier film 11 shown in FIG. 1 with only one barrier coating. The coated barrier film 18 because of the two barrier coatings 16 and 17 has a reduced optical transmission compared to the transmission of the coated barrier film 11 shown in FIG. 1.

Figure 3:
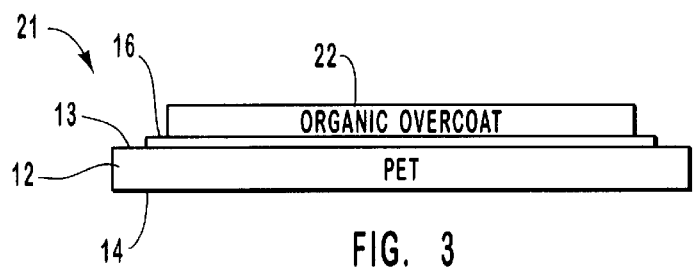
FIG. 3 is a cross-sectional view similar to FIG. 1, but showing the use of an organic overcoat on the barrier coating.

In order to achieve still further improved characteristics for the coated barrier film, a barrier film 21 is shown in FIG. 3 in which an organic overcoat 22 is deposited on the barrier film 21. The organic overcoat 22 substantially increases the impermeability of the barrier coating 16 even though the organic overcoat in and of itself had very little, if any, effect on the vapor barrier characteristics of the plastic substrate 12. Various types of organic coatings can be provided. For example, Emerez 1533 polyamide manufactured by Emery Industries was mixed in a common solvent, tetrahydrofuran (THF) at a ratio of 25% to 75% by weight respectively. Another organic coating was formed by taking 25% of the Emerez 1533 solution and combining it with 1,6-diisocyanatohexane (HDI, a cross-linker) and a 1% polymethyl trifluoropropylsiloxane (Petrarch, PS 181) in THF solution at a ratio of 96.4%, 1.5%, 2.1%, respectively by weight. Another organic coating contained 95.7% of the 25% E1533, 1.9% toluene diisocyanate (TDI) and 2.4% of the 1% PS 181. Optimum results were achieved using an organic overcoat in the form of a polyamide coating without the use of cross-linkers or special solvents because it was found that their additions did not significantly affect the characteristics of the organic overcoat.

These organic coatings were applied in a wet layer of 0.005 inches thick to provide a final coating of 0.0009 inches to 0.0010 inches thick after evaporation of the THF. The samples containing HDI and TDI were baked at 100° C. for 30 minutes to activate the cross-linker.

The placement of the carbon-like barrier coating on the plastic film achieved a reduction in WVTR of more than 90%. The WVTR was further reduced by another 50 to 60% by the application of the organic overcoating hereinbefore described.

Figure 4:
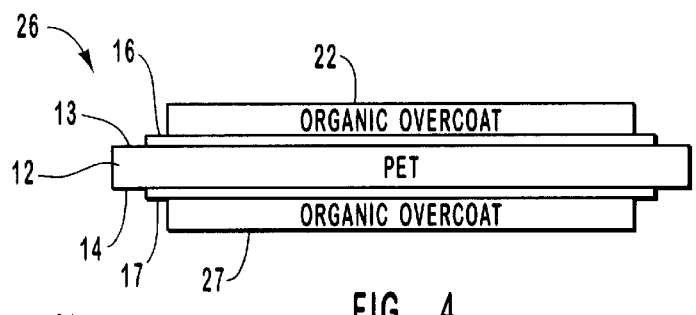
FIG. 4 is a cross-sectional view of a coated barrier film of the type shown in FIG. 2 with an organic overcoat provided on the barrier coatings on both sides of the film substrate.

When still further improved capability is desired, a coated barrier film 26 of the type shown in FIG. 4 can be provided with an additional organic overcoat 27 provided on the second barrier coating 17 so that there is provided a barrier coating on both surfaces of the flexible film substrate as well as an organic overcoat on both barrier coatings.

Figure 5:
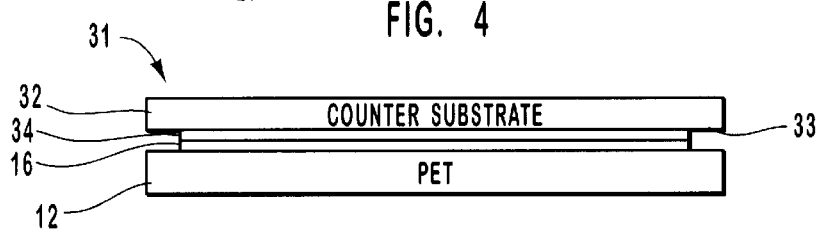
FIG. 5 is a cross-sectional view of a coated barrier film of the type shown in FIG. 1 in a laminated structure.

In FIG. 5 there is shown another embodiment of the present invention in which the coated barrier film is utilized in a laminated structure 31. The structure 31, as shown in FIG. 5, is comprised of the substrate 12 and the graphite layer 16 hereinbefore described. A flexible plastic layer 32 is provided formed of a suitable laminating film, as for example, polypropylene, polyester or other heat sealable film. One surface 33 of the layer 32 is coated with a suitable laminate adhesive 34. The counter substrate 32 with the adhesives 34 can then be secured to the barrier film comprised of the substrate 12 and the graphite layer 16 to provide the composite structure 31 which has the excellent barrier characteristics hereinbefore described and which also can be heat sealed onto itself. This makes it possible to utilize the layered or laminated structure 31 shown in FIG. 5 for making self-contained bags or wrappings which can be sealed on themselves by the use of heat. For example, polypropylene can be sealed on itself. Thus, a bag can be made with such a material which could be filled with a liquid. In such an orientation, the liquid would face the polyester, or alternatively, if desired the polypropylene or the polyethylene could face the liquid. The main criteria are that the graphite layer is covered and that the heat sealable material face inwardly so that the bag or package can be self-sealed by the application of heat.

Figure 6:
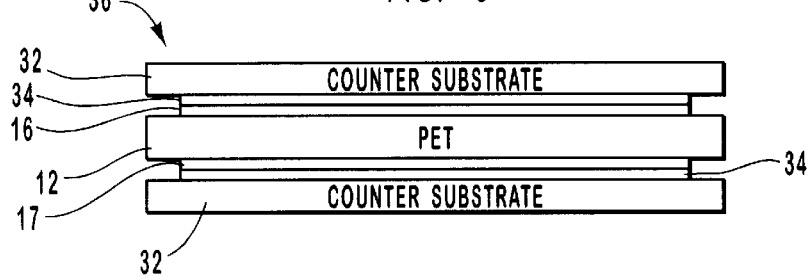
FIG. 6 is a cross-sectional view of a coated barrier film of the type shown in FIG. 2 in a laminated structure.

Another embodiment of the invention is shown in FIG. 6 in which another laminated structure 36 is shown utilizing a barrier film of the present invention in which an additional flexible plastic layer is laminated to both sides of the barrier film 18 shown in FIG. 2. A laminating layer 32 of the type hereinbefore described provided with a laminate adhesive 34 so that, for example, heat sealable plastic layers can be provided on both sides of the barrier film 18 as shown in FIG. 2. In this way, it is possible to provide a structure which permits heat sealing on either side so that bags or wrappings can be formed by folding the laminated structure 36 so that either side can be folded inwardly onto itself or to the other surface and sealed.

From the foregoing it can be seen that there has been provided a coated flexible barrier film which has excellent water vapor and oxygen impermeability characteristics and which has a neutral or light gray color so that it is substantially colorless. The visual transmission preferably can vary from 30 to 70%. The coated barrier film of the present invention has achieved adequate adhesion and low levels of impermeability where the barrier coating has been deposited on film substrates at room temperature. Calculations show that the barrier film described herein is inherently a better barrier against water vapor than the coating described in U.S. Pat. No. 4,557,946. The permeability constant for the present film is calculated to be approximately $10^{-13}$ cc cm/cm$^2$ sec. cm Hg vs $10^{-9}$ cc cm/cm$^2$ sec. cm Hg for the coating disclosed in U.S. Pat. No. 4,557,946. Thus, the carbon coating herein reported has a four order of magnitude lower permeability constant.

Figure 7:
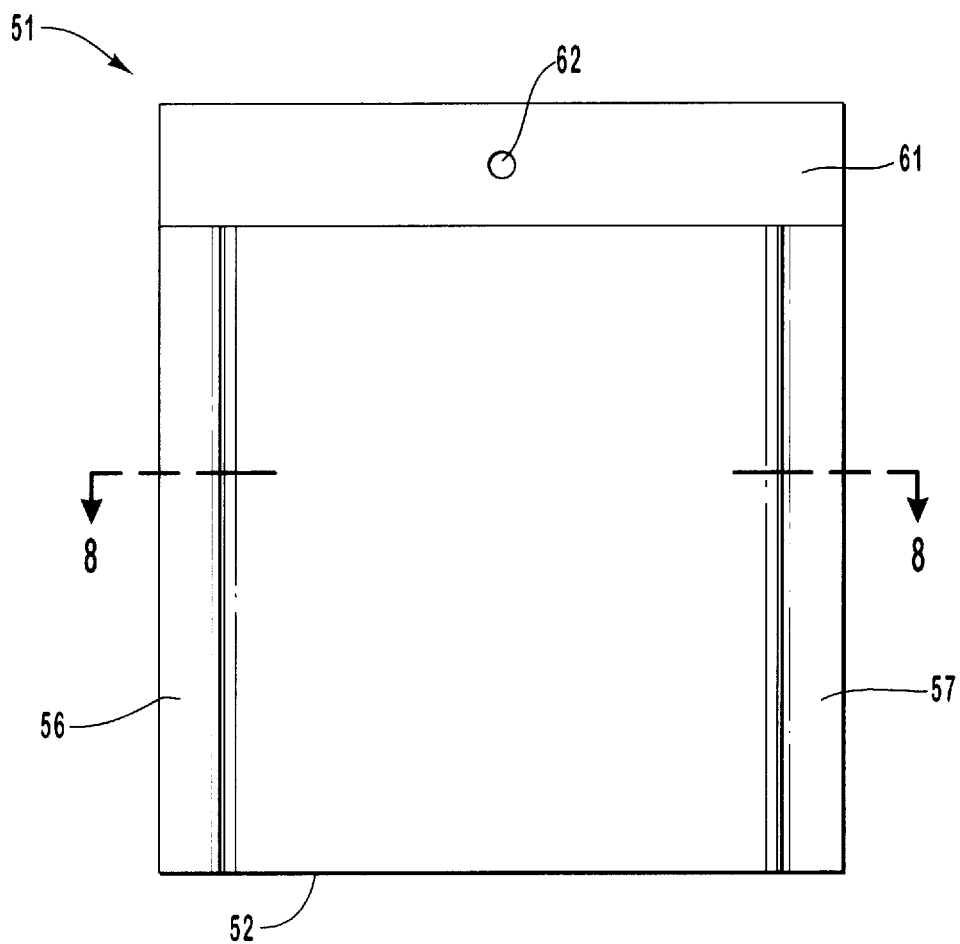
FIG. 7 is a side-elevational view of a package utilizing the barrier film of the present invention.
Figure 8:
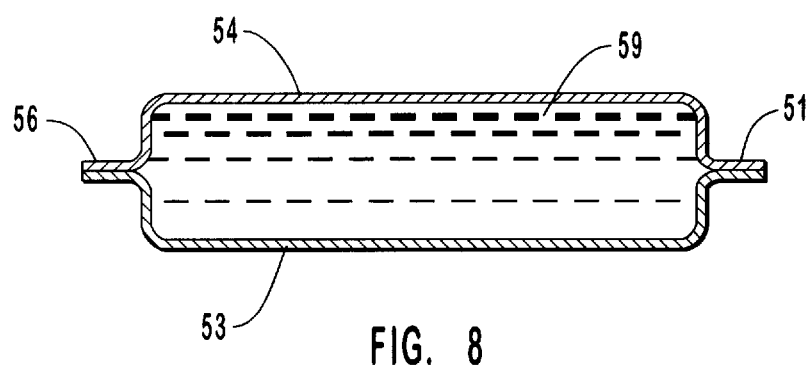
FIG. 8 is a cross-sectional view taken along the line 8—8 of FIG. 7.

In FIGS. 7 and 8, there is shown representative packaging or wrapping which can utilize the coated barrier film of the present invention. Thus, there is shown a bag or package 51 which incorporates the coated barrier film of the present invention. The bag or package 51 is formed from a single sheet of coated barrier film to form a bag having a bottom wall 52 and side walls 53 and 54 which have their outer margins sealed together in fin seals 56 and 57 on opposite sides of the package so that there remains an open top end. When the bag 51 has been filled with a material 59, such as a liquid or a solid which is sensitive to water and oxygen, the top of the bag 51 can be sealed with a similar type fin seal 61 to completely seal the material contained within the bag 51 from exterior ambient conditions. As shown in FIG. 7, a hole 62 can be provided in the top fin seal 61 to facilitate placing the bag 51 on a conventional hanger or rack for display to the prospective customer.

From the foregoing description of the bag shown in FIGS. 7 and 8, it can been seen that the coated barrier film of the present invention can be utilized in such bags or other different types of packaging or wrapping by utilizing the heat sealable surfaces provided in the fin seals hereinbefore described. As also previously explained, rather than providing heat sealable surfaces, the coated barrier films can be bonded together by the use of adhesives. Also, it should be appreciated that other types of seals can be provided other than the fin seals shown, as for example lap seals.

By utilizing the coated barrier films of the present invention in such packaging, in addition to the material contained therein being protected from water vapor and oxygen, the material contained therein can be viewed from the exterior because of the transparency provided and can be viewed in its natural state or color, since the coated barrier film is substantially colorless.

What is claimed is:

1. A package or wrapping for providing protection from water and oxygen vapor comprised of a material in the form of a liquid or a solid which is sensitive to water and oxygen, a coated barrier film sealed about said material and forming a sealed enclosure about said material and serving to protect said material from water vapor and oxygen, said coated barrier film comprising a flexible substantially transparent plastic substrate having first and second surfaces and having a thickness ranging from 1 to 7 mils, a substantially colorless barrier coating formed on one of said first and second surfaces and consisting of graphite free of hydrogen having a thickness ranging from 50Å to 300Å, said barrier film having a reduced water transmission rate and a reduced oxygen transmission rate with respect to the uncoated substrate and having a visible transparency of 30% or greater.

2. A package or wrapping as in claim 1 wherein said coated barrier film has an additional substantially colorless barrier coating substantially identical to the first named barrier coating formed on the other of said first and second surfaces.

3. A package or wrapping as in claim 1 wherein said coated barrier film includes an organic overcoat overlying the barrier coating.

4. A package or wrapping as in claim 2 wherein said coated barrier film includes an organic overcoat overlying each of the first named and additional barrier coatings.

5. A package or wrapping as in claim 3 wherein the organic overcoat is essentially polyamide.

6. A package or wrapping as in claim 1 wherein said coated barrier film includes a layer of flexible plastic material laminated to the barrier coating.

7. A package or wrapping as in claim 6 wherein said plastic material is formed of a material that can be heat sealed onto itself.

8. A packaging or wrapping as in claim 2 wherein said coated barrier film includes a flexible layer of plastic material laminated to each of said first named and additional barrier coatings.

9. A package or wrapping as in claim 8 wherein said coated barrier film includes an adhesive disposed between the layer of plastic material and the first named and additional barrier coatings.

10. A package for wrapping as in claim 1, wherein said coated barrier film has a moisture vapor transmission rate between 0.63 and 0.02 grams/100 square inches/twenty four period at 100° F. at 90% relative humidity and an oxygen transmission rate of between 1.97 and 0.040 cubic cm per 100 square inches/day at 74° F. at one atmosphere and a relative humidity of 0%.

\* \* \* \* \*